United States Patent
Yang et al.

(10) Patent No.: US 8,445,342 B2
(45) Date of Patent: May 21, 2013

(54) SHORT CHANNEL SEMICONDUCTOR DEVICES WITH REDUCED HALO DIFFUSION

(75) Inventors: Bin Yang, Mahwah, NJ (US); Man Fai Ng, Poughkeepsie, NY (US)

(73) Assignee: Globalfoundries Inc., Grand Cayman (KY)

( * ) Notice: Subject to any disclaimer, the term of this patent is extended or adjusted under 35 U.S.C. 154(b) by 300 days.

(21) Appl. No.: 12/821,507

(22) Filed: Jun. 23, 2010

(65) Prior Publication Data
US 2011/0316093 A1  Dec. 29, 2011

(51) Int. Cl.
*H01L 21/338* (2006.01)

(52) U.S. Cl.
USPC ........... 438/183; 438/290; 438/302; 438/595; 257/E21.437

(58) Field of Classification Search
USPC ............... 438/197, 585, 199, 183, 289, 290, 438/299, 302, 595; 257/E21.437
See application file for complete search history.

(56) References Cited

U.S. PATENT DOCUMENTS

2011/0073961 A1 * 3/2011 Dennard et al. ............. 257/408
2011/0281409 A1 * 11/2011 Ellis-Monaghan et al. .. 438/229

* cited by examiner

*Primary Examiner* — Jack Chen
(74) *Attorney, Agent, or Firm* — Ditthavong Mori & Steiner, P.C.

(57) ABSTRACT

A short channel semiconductor device is formed with halo regions that are separated from the bottom of the gate electrode and from each other. Embodiments include implanting halo regions after forming source/drain regions and source/drain extension regions. An embodiment includes forming source/drain extension regions in a substrate, forming source/drain regions in the substrate, forming halo regions under the source/drain extension regions, after forming the source drain regions, and forming a gate electrode on the substrate between the source/drain regions. By forming the halo regions after the high temperature processing involved informing the source/drain and source/drain extension regions, halo diffusion is minimized, thereby maintaining sufficient distance between halo regions and reducing short channel NMOS Vt roll-off.

10 Claims, 4 Drawing Sheets

SHORT CHANNEL SEMICONDUCTOR DEVICES WITH REDUCED HALO DIFFUSION

TECHNICAL FIELD

The present disclosure relates to semiconductor devices with improved halo implants. The present disclosure is particularly applicable to CMOS semiconductor devices in 22 nanometer (nm) technology nodes and beyond.

BACKGROUND

As reductions in device scaling continue, the thickness of spacers and channel length are reduced, leading to a parasitic current path between the source and drain caused by source/drain punch-through, particularly in 22 nm node devices and beyond. To avoid source/drain punch-through, dopants are conventionally incorporated in source/drains by employing in-situ-doped epitaxially-grown source/drains for both NMOS and PMOS devices. Typically NMOS devices include in-situ phosphorous-doped silicon (Si) or silicon carbon (Si:C) source/drains, and PMOS devices include in-situ boron-doped silicon germanium (SiGe) source/drains.

Dopant implantation techniques, however, have not proved successful. Epitaxial growth of in-situ-doped source/drains adds additional thermal exposure to previously diffused halo and extension regions, thereby causing excessive dopant diffusion, particularly high diffusivity dopants, such as boron (B), in halo regions of NMOS devices. During high temperature epitaxial (EPI) pre-bake, significant B diffusion occurs leading to unacceptably high NMOS threshold voltage (Vt) roll-off. Lowering the EPI pre-bake temperature can reduce the short channel NMOS Vt roll-off. For example, as shown in FIG. 1, roll-off 101 at 750° C. is less than roll-off 103 at the conventional 850° C. However, even with pre-bake temperatures of about 750° C., the NMOS Vt roll-off is too large for short channel devices. Ideally, there should be virtually no roll-off, such that the lines in FIG. 1 are substantially horizontal.

Although lower NMOS EPI pre-bake temperatures reduce NMOS halo diffusion, they also prevent full recrystallization of the amorphized extension regions. As a result, cavities/voids are formed during Si:C EPI growth thereby degrading resistance of the NMOS.

A need therefore exists for methodology enabling the formation of a CMOS device with reduced NMOS halo diffusion and fully recrystallized extension regions, and the resulting short channel device.

SUMMARY

An aspect of the present disclosure is an improved method of fabricating a short channel semiconductor device by implanting halo regions after forming both source/drain and also source/drain extension regions.

Another aspect of the present disclosure is a short channel semiconductor device with halo regions separated from the gate electrode and from each other.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a short channel semiconductor device, the method comprising: forming source/drain extension regions in a substrate; forming source/drain regions in the substrate; forming halo regions under the source/drain extension regions, after forming the source drain regions; and forming a gate electrode on the substrate between the source/drain regions.

Aspects of the present disclosure include forming a removable gate on the substrate prior to forming the source/drain extension regions, and removing the removable gate prior to forming the halo regions. Further aspects include forming spacers on each side of the removable gate prior to forming the source/drain extension regions, and forming the gate electrode in the opening between the spacers. Another aspect includes forming a metal gate electrode between the spacers. Additional aspects include forming the source/drain regions by in-situ doped epitaxial growth. Other aspects include high temperature prebaking prior to the epitaxial growth. Further aspects include forming the halo regions by implanting a dopant at an angle to the substrate through the opening between the spacers. Another aspect includes rapid thermal annealing or laser spike annealing to drive in the source/drain extension regions prior to forming the source/drain regions. Additional aspects include forming a dielectric layer on the substrate after forming the source/drain regions, and chemical mechanical polishing the dielectric layer prior to removing the removable gate.

Another aspect of the present disclosure is a short channel semiconductor device comprising: a gate electrode on a substrate; source/drain regions on the substrate on each side of the gate electrode; halo regions under the source/drain regions, wherein the halo regions are separated from the bottom of the gate electrode and from each other.

Aspects include a semiconductor device including a gate length of 24 nm to 26 nm, and a separation distance between the halo regions of 8 nm to 10 nm. Further aspects include the halo regions being separated from the bottom of the gate electrode by 10 nm. Another aspect includes the halo regions having a peak concentration separated from each other by a distance of 16 nm to 18 nm. Additional aspects include source/drain extension regions on the substrate on each side of the gate electrode, wherein the halo regions are formed under the extension regions, and the gate electrode is formed of metal. Other aspects include the source/drain regions being epitaxially grown silicon carbon in-situ doped with phosphorous. Further aspects include the halo regions being formed by implanting boron in the substrate, and the extension regions being formed by implanting arsenic.

Another aspect of the present disclosure is a method of fabricating a semiconductor device, the method comprising: forming first and second removable gates on a substrate; forming first spacers on each side of the first removable gate and second spacers on each side of the second removable gate; forming first source/drain extension regions on the substrate on each side of the first removable gate by implanting arsenic in the substrate and second source/drain extension regions on the substrate on each side of the second removable gate by implanting boron in the substrate; rapid thermal annealing the first and second extension regions; forming first source/drain regions on the substrate on each side of the first removable gate and second source/drain regions on the substrate on each side of the second removable gate; removing the first and second removable gates, thereby forming first and second openings between the first and second spacers, respectively, after forming the first and second source/drain regions; forming first halo regions under the first source/drain extension regions by implanting boron at an angle to the substrate through the first opening and second halo regions under the second source/drain extension regions by implanting arsenic at an angle to the substrate through the second opening; and forming a first gate electrode on the substrate in the first opening and a second gate electrode on the substrate in the second opening.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
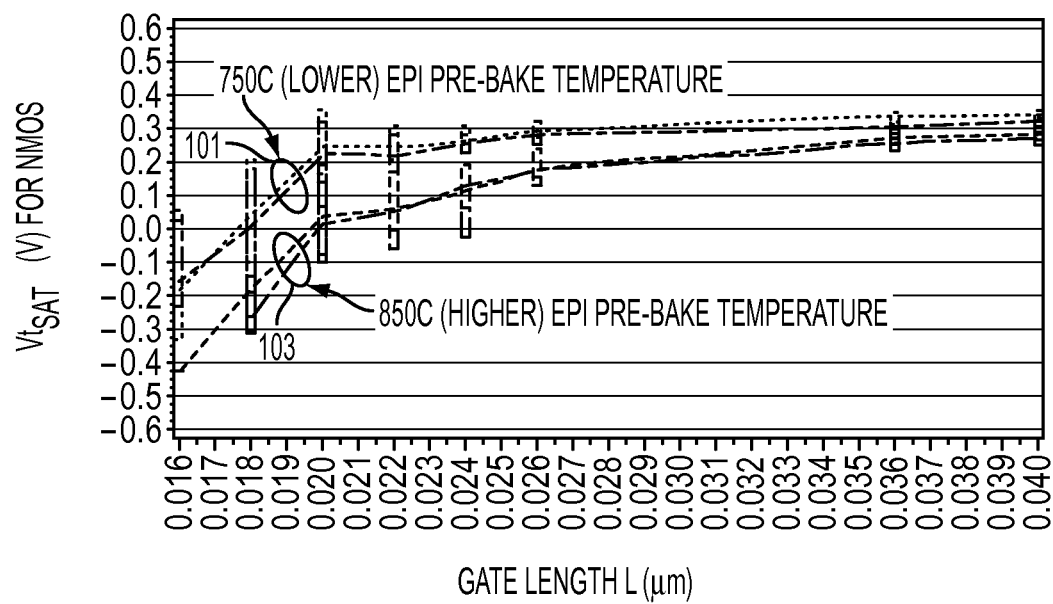
FIG. 1 graphically illustrates Vt roll-off of an 22 nm node NMOS at 750° C. and 850° C.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

In an attempt to minimize NMOS halo diffusion without causing voids a dry chemical preclean, such as Applied Materials Siconi preclean, was implemented. With essentially a plasma pre-clean process, no thermal baking is required for EPI growth. However, extension-to-source/drain voids occurred similar to those formed with lower pre-bake temperatures. An attempt was also made to slow down B diffusion by co-implanting carbon (C) with B. However, the benefit from the C co-implant was too small to significantly reduce the NMOS roll-off degradation. An attempt was also been made to employ indium (In) instead of B for NMOS halo implants, since In is a heavier and larger dopant, and, therefore, diffuses more slowly than B. However, it was found that In could not withstand the excessive EPI pre-bake thermal process.

The present disclosure addresses and solves the NMOS halo diffusion and NMOS extension region partial recrystallization problems associated with a 22 nm-node or smaller CMOS device. In accordance with embodiments of the present disclosure, halo implantation is postponed to avoid exposure to elevated temperatures, e.g., until after a replacement gate is removed. In this embodiment the allowed angle range is greater for the tilted halo implant, and the halo region is not exposed to high temperature processes such as RTA or EPI prebake thermal processes. Therefore, halo diffusion is avoided and short channel device Vt roll-off is improved.

Methodology in accordance with embodiments of the present disclosure includes forming source/drain extension regions in a substrate, forming source/drain regions in the substrate, forming halo regions under the source/drain extension regions after forming the source drain regions, and forming a gate electrode on the substrate between the source/drain regions.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 2A through 2D schematically illustrate sequential steps of a method in accordance with an exemplary embodiment. FIGS. 3A through 3D schematically illustrate sequential steps of a method in accordance with a conventional method. Adverting to FIG. 2A, a gate stack 201 is formed by a conventional method on a silicon substrate 203 for each PMOS and NMOS. (Only the NMOS is shown for illustrative convenience.) The gate stack may include a high-k dielectric layer 205, metal layer 207, sacrificial gate electrode 209, for example of polysilicon, cap layer 211, and spacers 213. Similarly, in prior art FIG. 3A, gate stack 301 is formed on silicon substrate 303 for each PMOS and NMOS. (Only the NMOS is shown for illustrative convenience.) Each gate stack includes a high-k dielectric layer 305, metal layer 307, sacrificial gate electrode 209, such as polysilicon, cap layer 311, and spacers 213.

Figure 2A:
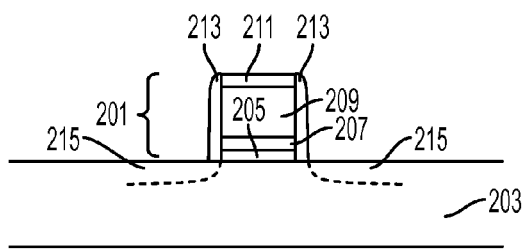
FIGS. 2A through 2D sequential steps of a method in accordance with an exemplary embodiment.
Figure 3A:
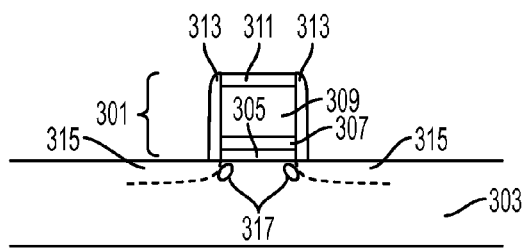
FIGS. 3A through 3D sequential steps of a method in accordance with the prior art.

As illustrated in FIG. 2A, extension regions 215 may be implanted by conventional methods with arsenic (As) for NMOS devices and B in the form of boron difluoride ($BF_2$) for PMOS devices. Correspondingly, extension regions 315 are implanted in the prior art, as shown in FIG. 3A. Halo regions 317 are then implanted with B for NMOS and with As for PMOS devices in accordance with conventional practices (FIG. 3A). However, contrary to conventional processing, according to the exemplary embodiment and illustrated in FIG. 2A, halo regions are not yet implanted. Rapid thermal anneal (RTA) or laser spike anneal (LSA) activation annealing may be implemented to drive in the extensions 215 (in FIG. 2A) or extension regions 315 and halo regions 317 (in FIG. 3A).

Figure 2B:
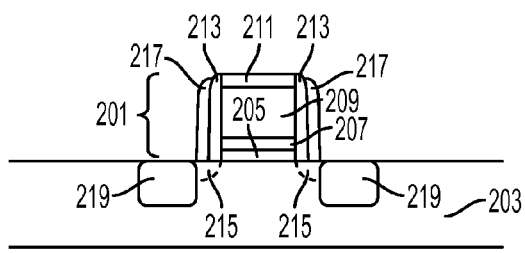
Figure 3B:
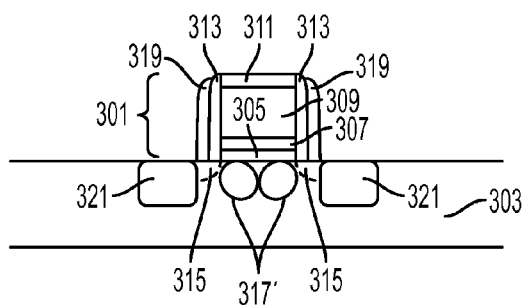

As illustrated in FIG. 2B, second spacers 217 may be formed, and source/drain regions 219 may be epitaxially formed and in-situ doped by conventional methods. For a PMOS source drain regions 219 may be in-situ doped eSiGe, and for an NMOS source/drain regions 219 may be in-situ phosphorus-doped eSi:C (or silicon). Corresponding second spacers 319 and in-situ doped epitaxially formed source/drain regions 321 are illustrated in FIG. 3B. As shown in FIG. 3B, during EPI pre-bake processes in an NMOS device, at 750° C. for 3 minutes and 850° C. for 3 minutes, the halo implant 317 diffuses, forming halo regions 317'. Halo diffusion may also occur in PMOS devices, but to a lesser degree. On the other hand, since halo regions have not yet been formed according to the exemplary embodiment, no halo diffusion occurs (FIG. 2B).

Figure 2C:
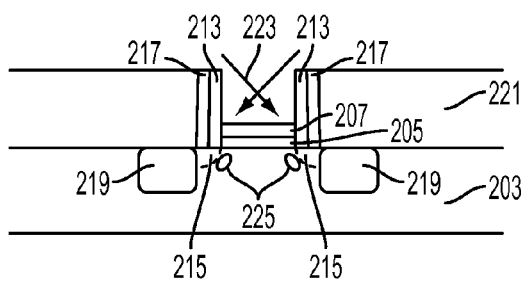
Figure 3C:
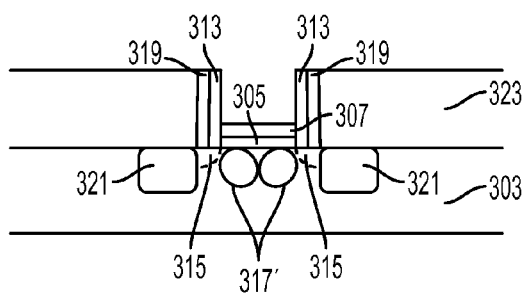

Adverting to FIG. 2C, a dielectric layer 221, for example silicon dioxide, is deposited and planarized, as by chemical mechanical polishing (CMP). Then, the sacrificial gate 209 is removed. According to conventional practices, dielectric layer 323 is deposited and planarized, and sacrificial gate 309 is removed. Post gate removal, according an exemplary embodiment and as illustrated in FIG. 2C, a tilted halo implant 223 may be performed, thereby forming halo 225. Because of the short distance between the spacers and the reduced height of the gate stack after CMP (e.g., 40 nm versus 70 nm during halo implantation in conventional halo formation), the angle of tilt for the halo implant can be controlled such that halo regions 225 are formed only under spacers 213. No corresponding step is performed in conventional methodology, as halo regions 317' were already formed with extension regions 315.

Figure 4A:
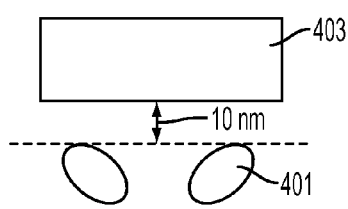
FIG. 4A schematically illustrate relative positions of the halo regions and the gate electrode in accordance with an exemplary embodiment.
Figure 5A:
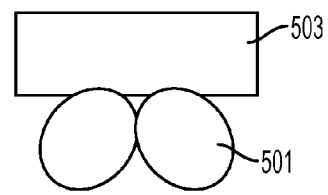
FIG. 5A schematically illustrates relative positions of the halo regions and the gate electrode in accordance with the prior art.
Figure 4B:
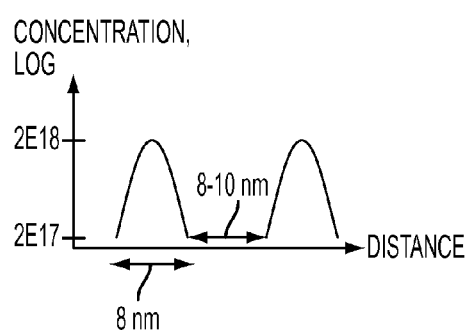
FIG. 4B schematically illustrates the concentration distribution of the halo regions in accordance with an exemplary embodiment.
Figure 5B:
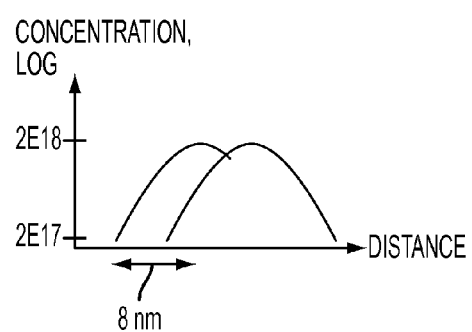
FIG. 5B schematically illustrates the concentration distribution of the halo regions in accordance with the prior art.

A comparison of the halo regions formed in the present disclosure with those formed employing conventional methodology for a 22 nm-node device, is shown in FIGS. 4 and 5. As shown in FIG. 4A, according to an exemplary embodiment, halo regions 401 are formed at a distance of 10 nm below gate electrode 403 and are separated from each other. FIG. 4B schematically illustrates the concentration distribution of halo regions 401, with the concentration ranging from 2E17 to a peak concentration of 2E18, and the separation distance between halo regions being 8 to 10 nm. On the other hand, according to conventional processing and illustrated in FIG. 5A, halo regions 501 are diffused to the bottom of gate 503 and to each other. The concentration distribution of the two halo regions is therefore overlapping, as shown in FIG. 5B.

Figure 2D:
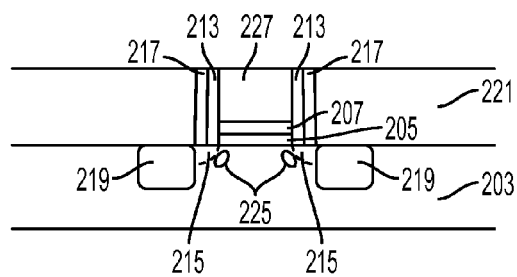
Figure 3D:
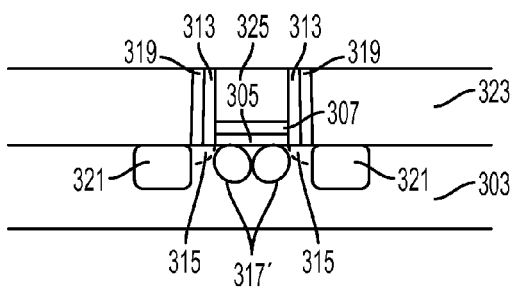

Adverting to FIG. 2D, after the halo regions 225 are formed, a low temperature thermal anneal, e.g., less than 400° C., may be performed. Then, a metal replacement gate 227 may be formed in the space between first spacers 213. Similarly, in conventional practices, a metal replacement gate 325 may be formed in the space between first spacers 313, as illustrated in FIG. 3D.

Figure 6:
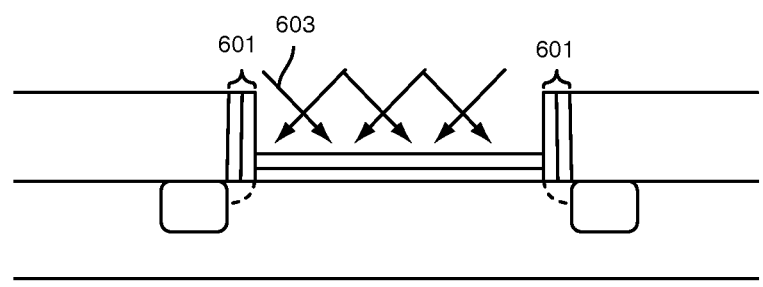
FIG. 6 schematically illustrates tilted halo implantation in a long channel device.

Adverting to FIG. 6, in a long channel device, the gap between spacers 601 is too large for halo implantation, as the shadowing from the spacers is insufficient to limit the halo regions to below the spacers. As illustrated in FIG. 6, a tilted halo implantation 603 in a long channel device will result in halo regions under the entire channel. In contrast thereto, a tilted halo implantation in a short channel device results in halo regions only under the spacers, as illustrated in FIG. 2C. However, only the short channel devices have significant roll-off issues for the 22 nm node CMOS. Therefore, to fabricate both long and short channel devices with good Vt roll-off, conventional halo processes can be used for the long channel devices, and the present disclosure can be applied to the short channel devices with a mask, or photoresist, blocking the long channel (and exposing the short channel) during formation of the halo regions in the short channel device.

Embodiments of the present disclosure can achieve several technical effects, including reduced halo diffusion and improved short channel device Vt roll-off without sacrificing the quality of the epitaxially grown source/drain regions. In addition, the processes of the present disclosure are compatible with conventional replacement metal gate process flow. The present disclosure enjoys industrial applicability in any of various types of highly integrated semiconductor devices, particularly 22 nm mode devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method of fabricating a short channel semiconductor device, the method comprising:
    forming a removable gate on the substrate;
    forming spacers on each side of the removable gate;
    forming source/drain extension regions in a substrate;
    forming source/drain regions in the substrate;
    removing the removable gate, forming an opening between the spacers;
    forming halo regions under the source/drain extension regions through the opening, after forming the source drain regions; and
    forming a gate electrode on the substrate in the opening after the halo regions are formed.

2. The method according to claim 1, further comprising forming a metal gate electrode between the spacers.

3. The method according to claim 1, further comprising forming the source/drain regions by in-situ doped epitaxial growth.

4. The method according to claim 3, further comprising high temperature prebaking prior to the epitaxial growth.

5. The method according to claim 1, further comprising forming the halo regions by implanting a dopant at an angle to the substrate through the opening between the spacers.

6. The method according to claim 1, further comprising rapid thermal annealing or laser spike annealing to drive in the source/drain extension regions prior to forming the source/drain regions.

7. The method according to claim 2, further comprising:
    forming a dielectric layer on the substrate after forming the source/drain regions; and
    chemical mechanical polishing the dielectric layer prior to removing the removable gate.

8. A method of fabricating a semiconductor device, the method comprising:
    forming first and second removable gates on a substrate;
    forming first spacers on each side of the first removable gate and second spacers on each side of the second removable gate;
    forming first source/drain extension regions on the substrate on each side of the first removable gate by implanting arsenic in the substrate and second source/drain extension regions on the substrate on each side of the second removable gate by implanting boron in the substrate;
    rapid thermal annealing the first and second extension regions;

forming first source/drain regions on the substrate on each side of the first removable gate and second source/drain regions on the substrate on each side of the second removable gate;

removing the first and second removable gates, thereby forming first and second openings between the first and second spacers, respectively, after forming the first and second source/drain regions;

forming first halo regions under the first source/drain extension regions by implanting boron at an angle to the substrate through the first opening and second halo regions under the second source/drain extension regions by implanting arsenic at an angle to the substrate through the second opening; and forming a first gate electrode on the substrate in the first opening and a second gate electrode on the substrate in the second opening.

9. The method according to claim 8, comprising forming the first source/drain regions by in-situ phosphorous doped epitaxially growing silicon carbon, and forming the second source/drain regions by in-situ doped epitaxially growing silicon germanium.

10. The method according to claim 8, comprising:

forming a dielectric layer on the substrate after forming the first and second source/drain regions; and chemical mechanical polishing the dielectric layer prior to removing the first and second removable gates.

\* \* \* \* \*